United States Patent [19]
Chhabra

[11] Patent Number: 5,145,801
[45] Date of Patent: Sep. 8, 1992

[54] METHOD OF INCREASING THE SURFACE AREA OF A MINI-STACKED CAPACITOR

[75] Inventor: Navjot Chhabra, Boise, Id.
[73] Assignee: Micron Technology, Inc., Boise, Id.
[21] Appl. No.: 832,264
[22] Filed: Feb. 7, 1992
[51] Int. Cl.⁵ .......................................... H01L 21/70
[52] U.S. Cl. ........................................ 437/52; 437/47; 437/48; 437/60; 437/228; 437/235; 437/919
[58] Field of Search ................. 437/47, 48, 52, 60, 437/228, 233, 235, 919, 947, 981; 357/23.6; 365/149

[56] References Cited

U.S. PATENT DOCUMENTS

| 4,342,617 | 8/1982 | Fu et al. | 437/947 |
| 4,970,564 | 11/1990 | Kimura et al. | 357/23.6 |
| 5,043,298 | 8/1991 | Yamada et al. | 437/919 |

FOREIGN PATENT DOCUMENTS

| 0084024 | 4/1986 | Japan | 437/981 |
| 0293967 | 11/1988 | Japan | 437/919 |
| 0174767 | 7/1991 | Japan | 437/52 |

OTHER PUBLICATIONS

"3-Dimensional Stacked Capacitor Cell for 16M And 64M Drams", by T. Ema et al., pp. 592-595, IEDM 88.

*Primary Examiner*—Tom Thomas
*Attorney, Agent, or Firm*—David J. Paul

[57] ABSTRACT

A mini-stack capacitor process, developed for DRAM fabrication, is used to create a stacked capacitor by depositing multiple layers of dielectric over existing digit and word lines. The exposed top dielectric is then masked and etched away between two adjacent digit lines, the resist is stripped and subsequent etches (or etch) remove(s) the remaining dielectric layers thereby exposing the underlying conductively doped diffusion region. The storage node poly is then deposited and patterned, followed by subsequent depositions of a cell dielectric and cell plate poly. The selection of the number of dielectrics used and the type and/or sequence of dielectric etches used are the crux of the invention that substantially increases the surface area of a given stacked capacitor by approximately 40 to 80%.

11 Claims, 6 Drawing Sheets

METHOD OF INCREASING THE SURFACE AREA OF A MINI-STACKED CAPACITOR

FIELD OF THE INVENTION

This invention relates to semiconductor circuit memory storage devices and more particularly to a process for fabricating three-dimensional stacked cell capacitors used in high-density dynamic random access memory (DRAM) arrays.

BACKGROUND OF THE INVENTION

In dynamic semiconductor memory storage devices it is essential that storage node capacitor cell plates be large enough to retain an adequate charge or capacitance in spite of parasitic capacitances and noise that may be present during circuit operation. As is the case for most semiconductor integrated circuitry, circuit density is continuing to increase at a fairly constant rate. The issue of maintaining storage node capacitance is particularly important as the density of DRAM arrays continues to increase for future generations of memory devices.

The ability to densely pack storage cells while maintaining required capacitance levels is a crucial requirement of semiconductor manufacturing technologies if future generations of expanded memory array devices are to be successfully manufactured.

One method of maintaining, as well as increasing, storage node size in densely packed memory devices is through the use of a "stacked storage cell" design. With this technology, two or more layers of a conductive material such as polycrystalline silicon (polysilicon or poly) are deposited over an access device on a silicon wafer, with dielectric layers sandwiched between each poly layer. A cell constructed in this manner is known as a stacked capacitor cell (STC). Such a cell utilizes the space over the access device for capacitor plates, has a low soft error rate (SER) and may be used in conjunction with inter-plate insulative layers having a high dielectric constant.

However, it is difficult to obtain sufficient storage capacitance with a conventional STC capacitor as the storage electrode area is confined within the limits of its own cell area. Also, maintaining good dielectric breakdown characteristics between poly layers in the STC capacitor becomes a major concern once insulator thickness is appropriately scaled.

In a paper submitted by T. Ema et al., entitled "3-DIMENSIONAL STACKED CAPACITOR CELL FOR 16M AND 64M DRAMS," IEDM, Dig. Tech. Papers, pp. 592-595, 1988, discusses a 3-dimensional stacked capacitor fin structure.

The fin structure and its development is shown in FIG. 1, pp. 593 of the article mentioned above. The storage node is formed by two polysilicon layers, called fins, with gaps between the fins (the number of fins can be increased, but is limited by design rules used). Capacitor dielectric film surrounds the whole surface of the fins with polysilicon (used for a capacitor cell plate) covering the fins and filling in the gaps. This design can be fabricated using current methods and increases storage capacitance, but it is not suitable for a sub-micron (such as 0.2 micron) design rule DRAM cell because the total thickness of several fins and cell plate is much larger than minimum feature size. The process flow, needed to realize this fin structure, requires precise alignment between two adjacent word lines and digits lines. This alignment along with the requirement to have the storage node poly overlap the storage node contact leads to a larger cell area that is not suitable for 0.2 micron design rules mentioned previously.

The present invention develops a stacked cell similar to the fin cell having a single fin with a major and very important difference. The method to create the mini-stacked cell of the present invention maximizes the area available for the storage node plate that the fin cell uses up in order to connect the storage node plate to an active area. The first and second embodiments disclosed herein, gain substantial storage node plate surface in proximity of the storage node contact itself.

SUMMARY OF THE INVENTION

The invention is directed to maximizing storage cell surface area in a high density/high volume DRAM (dynamic random access memory) fabrication process. An existing stacked capacitor fabrication process is modified to construct a three-dimensional stacked capacitor, said process referred to hereinafter as a mini-stacked cell process or method. The mini-stacked method presented herein defines a capacitor storage cell that in the present invention is used in a DRAM process, however it will be evident to one skilled in the art to incorporate these steps into other processes requiring memory cells such as VRAMs, or other memory intensive devices and the like.

After a silicon wafer is prepared using conventional process steps, the mini-stack process further develops a process to create a stacked capacitor by depositing multiple layers of dielectric over existing digit and word lines. The exposed top dielectric is then masked and etched away between two adjacent digit lines, the resist is stripped and a subsequent etch remove the remaining dielectric layers thereby exposing the underlying conductively doped diffusion region. The storage node poly is deposited and patterned next followed by subsequent depositions of a cell dielectric and cell plate poly. The selection of the number of dielectrics used and the type and/or sequence of dielectric etches used are the crux of the invention that substantially increases the surface area of a given stacked capacitor by approximately 40 to 80%.

A first embodiment of a process for fabricating a DRAM storage capacitor on a silicon substrate having active areas, word lines and digit lines, is disclosed comprising the steps of:

a) forming a first dielectric layer on the existing surface of the silicon substrate;

b) forming a second dielectric layer adjacent and coextensive with the first dielectric layer;

c) forming a third dielectric layer adjacent and coextensive with the second dielectric layer;

d) placing and patterning a masking layer to provide an storage node location opening, with the opening thereby exposing a portion of the third dielectric between two adjacent digit lines;

e) etching the exposed portion of third dielectric through the opening thereby exposing the underlying second dielectric;

f) etching the second and first dielectrics through the opening thereby exposing the active areas;

g) removing the masking thereby exposing the remaining third dielectric layer;

h) placing a conformal first conductive layer adjacent and coextensive with the exposed active areas, the remaining exposed third dielectric and the patterned edges of the first, second and third dielectrics, with the first conductive layer making physical contact to the active areas;

i) masking and etching the first conductive layer thereby forming a storage node plate;

j) forming a cell dielectric layer superjacent and coextensive with the storage node plate; and k) depositing a second conductive layer superjacent and coextensive with the cell dielectric layer, thereby forming a top cell plate that is common to the entire memory array.

A second embodiment of a process for fabricating a DRAM storage capacitor on a silicon substrate having active areas, word lines and digit lines, is disclosed with the process comprising the steps of:

a) forming a first dielectric layer on the existing surface of the silicon substrate;

b) forming a second dielectric layer adjacent and coextensive with the first dielectric layer;

c) forming a third dielectric layer adjacent and coextensive with the second dielectric layer;

d) placing and patterning a masking layer to provide a storage node location opening, with the opening thereby exposing a portion of the third dielectric between two adjacent digit lines;

e) etching the exposed portion of third dielectric through the opening thereby exposing the underlying second dielectric;

f) removing the masking layer thereby exposing the remaining third dielectric layer;

g) forming a fourth dielectric layer thereby exposing the coextensive with the remaining third dielectric layer and the exposed portion of said second dielectric;

h) forming a fifth dielectric layer superjacent and coextensive with the fourth dielectric layer;

i) placing and patterning a second masking layer at storage node location opening, with the opening thereby exposing a portion of the fifth dielectric between two adjacent digit lines;

j) etching the exposed portion of the fifth dielectric through the opening thereby exposing the underlying fourth dielectric;

k) etching fourth, second and first dielectrics through the opening thereby exposing the active areas;

l) removing the masking thereby exposing the remaining third dielectric layer;

m) placing a conformal first conductive layer adjacent and coextensive with the exposed active areas, the remaining exposed fifth dielectric and the patterned edges of the first, second, third and fourth dielectrics, with the first conductive layer making physical contact to the active areas;

n) masking and etching the first conductive layer thereby forming a storage node plate;

o) etching the remaining fifth dielectric layer thereby exposing underside portions of the storage node plate;

p) forming a cell dielectric layer superjacent and coextensive with the exposed portions of the storage node plate; and q) depositing a second conductive layer superjacent and coextensive with the cell dielectric layer, thereby forming a top cell plate that is common to the entire memory array.

DETAILED DESCRIPTION OF THE PREFERRED EMBODIMENTS

The present invention is directed to maximizing storage cell surface area in a high density/high volume DRAM fabrication process. A silicon wafer is prepared using conventional process steps up to the point of defining a cell array. The capacitor of each cell will make contact with a buried contact within the cell, while the capacitor will extend to the active area of an adjacent cell. Each active area within the array is isolated from one another by a thick field oxide. The active areas can be arranged in interdigitated columns and non-interdigitated rows or simply parallel and in line to one another in both the vertical and horizontal directions. The active areas are used to form active MOS transistors that can be doped as NMOS or PMOS type FETs depending on the desired use.

Figure 1:
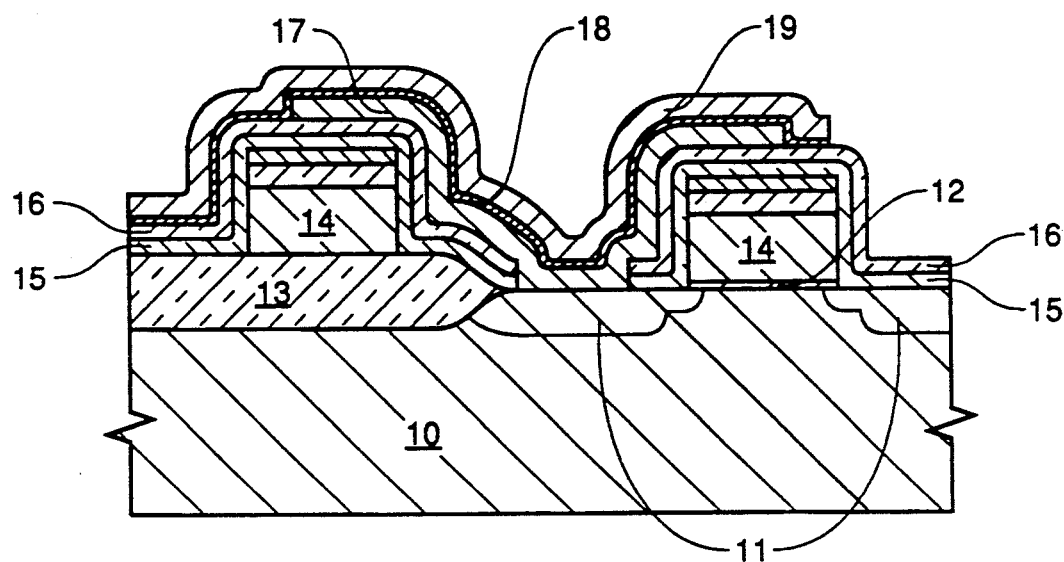
FIG. 1 is a composite cross-sectional view of a typical stacked capacitor cell.

FIG. 1 shows a cross-sectional view of how a typical mini-stacked capacitor may be constructed. Active area 11 is formed in substrate 10 and digit lines 14 have been patterned over thin oxide 12 as well as thick oxide 13. Digit lines 14 are then isolated from subsequent conductive layers by dielectrics 15 and 16. An etch has allowed access to active area 11 and a poly storage node plate 17 is patterned out of a deposited layer of polysilicon. Finally the storage cell is completed by depositions of cell nitride 18 and cell plate poly 19, respectively. The surface area of this type of mini-stacked capacitor's storage node plate would be typically in the neighborhood of 6.5 $\mu^2$ when developed for dense DRAMs such as 4M.

Figure 2:
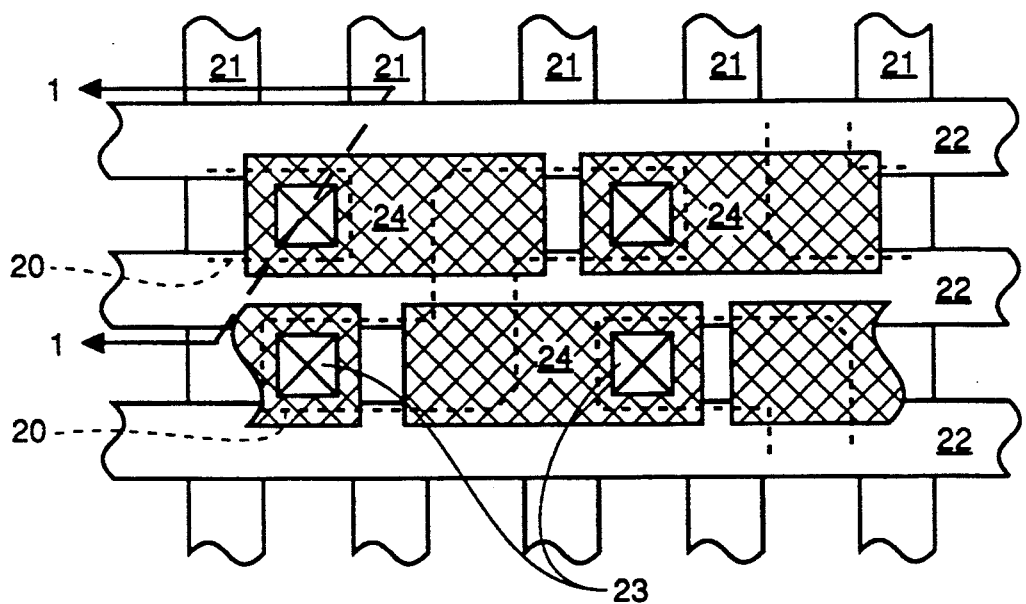
FIG. 2 is a top planar view of a portion of an in-process wafer showing digit lines, word lines and storage capacitors.

FIG. 2 shows a top planar view portion of a completed multilayered memory array with the main building blocks of a mini-stacked cell comprising active areas 20, word lines 21, digit lines 22, storage node buried contacts 23 and storage node plates 24.

A first embodiment of the present invention, depicted in FIGS. 3–8, is described in the following text. The first embodiment, described herein, results in an increase of storage node plate surface area by approximately 36%.

Figure 3:
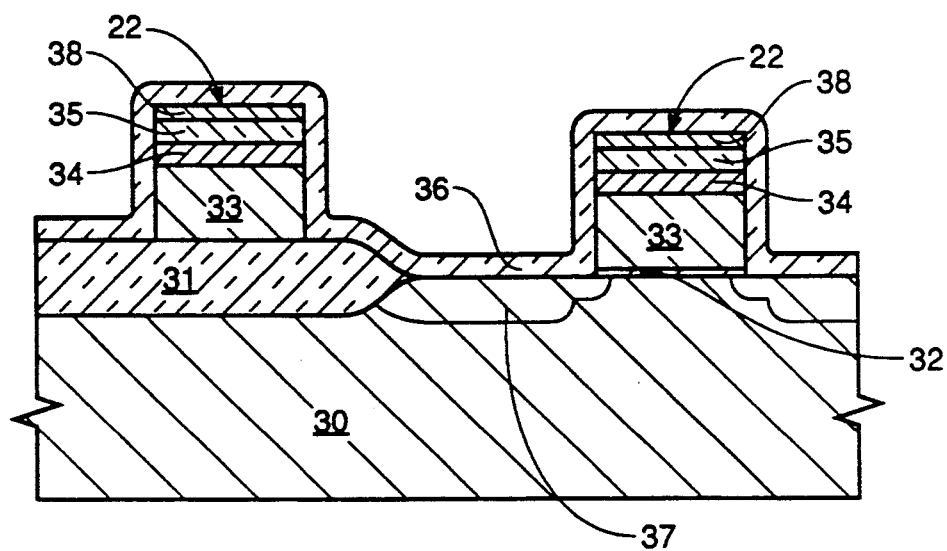
FIG. 3 is a cross-sectional view through broken line 1—1 of FIG. 2 following a conformal dielectric deposition over existing digit lines.

As shown in FIG. 3, digit lines 22 comprise patterned layers of gate oxide 32, over laid by polysilicon 33, tungsten silicide 34, and oxide/nitride cap 35 and 38, respectively. A preferred oxide/nitride cap is approximately 350 Å of oxide and 150 Å of nitride. In this cross-sectional view, digit lines 22 are also patterned to pass over thick oxide 31 where it is desired to isolate the digit lines from the underlying active area 37 or silicon substrate 30. Next, in light of the present invention, a conformal layer of TEOS oxide 36 (preferably 1000 Å thick) covers digit lines 22 and the exposed areas of thick oxide 31, active area 37 and silicon substrate 30. Next a self aligned phosphorus implant is performed to dope active area 37 as n-type conductivity.

Figure 4:
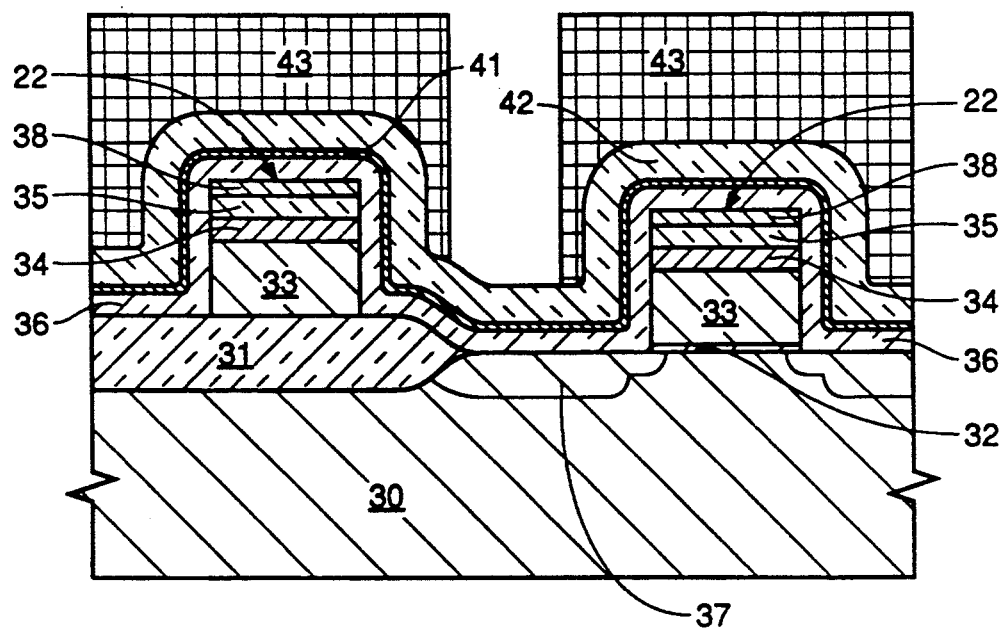
FIG. 4 is a cross-sectional view of the in-process wafer portion of FIG. 3 after depositions of two separate layers of dielectric followed by masking of the first dielectric layer.

Referring now to FIG. 4, approximately 100 Å of nitride 41 is deposited by low pressure chemical vapor deposition (known as LPCVD nitride) thereby blanketing oxide 36. Next a second layer of TEOS oxide 42 (approximately 2000 Å TEOS) is placed over nitride 41. Photoresist 43 is then placed and appropriately masked in order to allow subsequent etches of underlying dielectrics 42, 41 and 36, between digit lines 22, that will eventually expose active area 37. However, prior to the etches, oxide 42 is subjected to densification at a temperature of approximately 982° C.

Figure 5:
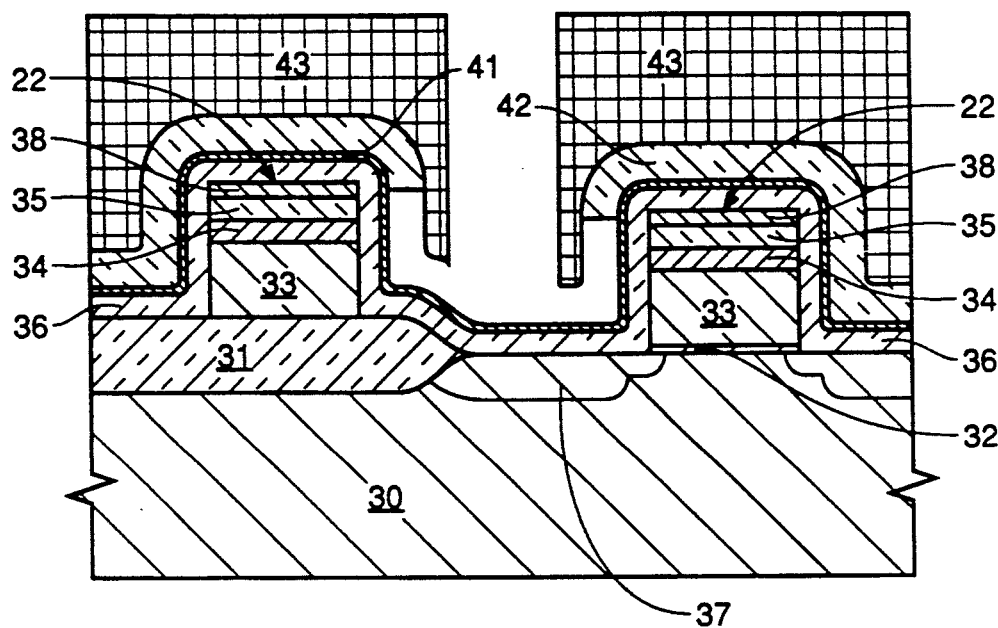
FIG. 5 is a cross-sectional view of the in-process wafer portion of FIG. 4 following the etching of said first dielectric.

Referring now to FIG. 5, a Buffered Oxide Etch (BOE) is performed for approximately 90 seconds to remove the exposed portion of oxide 42 residing between the two adjacent digit lines 22. Though the BOE etch is selective to oxide and will stop at nitride 41, it must be time controlled as the etch will continue to remove oxide 42 thereby tunneling under resist 43. In this embodiment however, the etch is allowed to continue in order to tunnel under resist 43 thereby removing approximately 0.75 $\mu$ of oxide 42.

Figure 6:
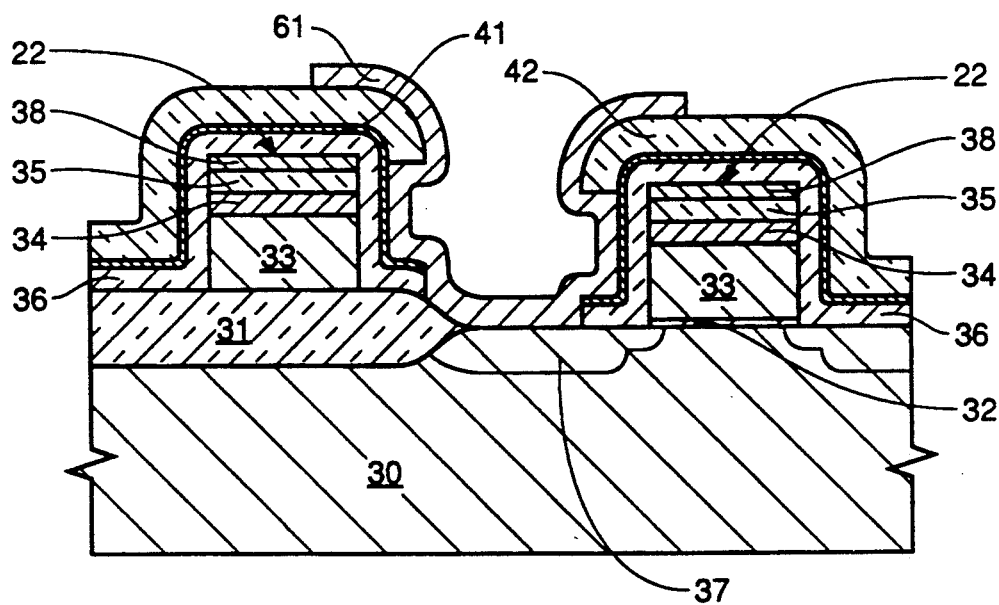
FIG. 6 is a cross-sectional view of the in-process wafer portion of FIG. 5 after a photoresist strip, followed by deposition and patterning of a storage node polysilicon plate.

Referring now to FIG. 6, a dry etch, such as the plasma etch $CF_4+CHF_3+He$, is performed to remove the portion of nitride 41 and oxide 36 overlying active area 37. Typically, the plasma etch mentioned above is performed for approximately 1 minute but, most importantly, the dry etch used must clear nitride 41 and oxide 36 from active area 37. Next, photoresist 43 (of FIG. 5) is stripped and a layer of conformal polysilicon 61 is deposited (preferably 1000 Å thick). Conformal poly layer 61 connects to active area 37 via buried contact opening 23. Poly 61 is then patterned (mask not shown) to form a poly storage node plate 61. The resulting surface area poly 61 is increased from a typical area of 6.5 $\mu^2$ to a larger surface area of 8.9 $\mu^2$ (or approximately 36%).

Figure 7:
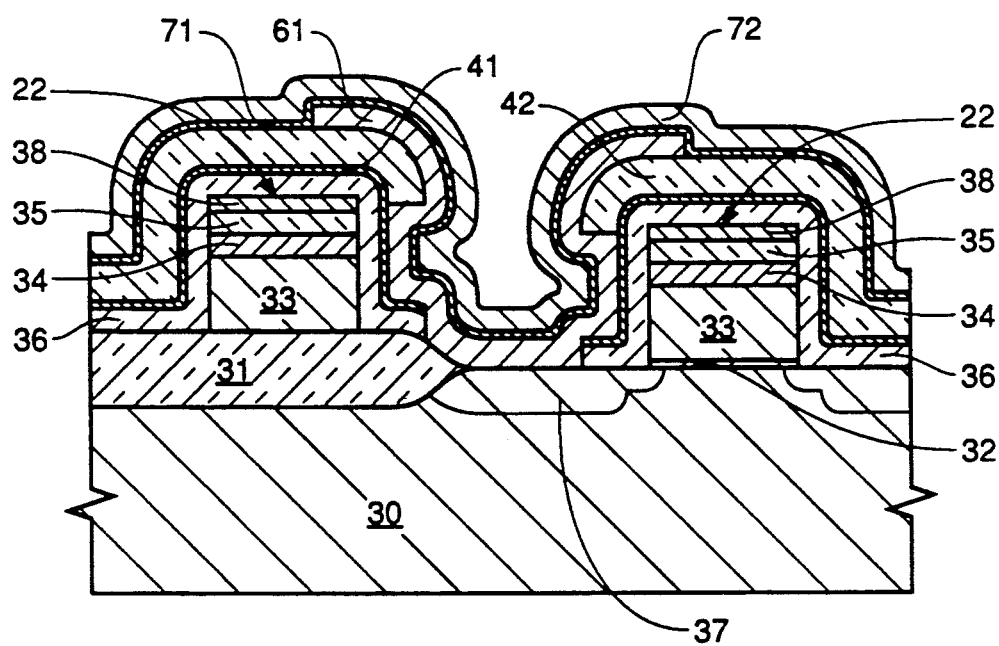
FIG. 7 is a cross-sectional view of the in-process wafer portion of FIG. 6, following depositions of conformal cell dielectric and cell plate polysilicon.

Referring now to FIG. 7, dielectric 71 is deposited (preferably by CVD) that conforms to poly storage node plate 61. Dielectric 71 may be selected from materials having a high dielectric constant (such as nitride, an oxide-nitride compound or $Ta_2O_5$) to serve as a cell dielectric for the mini-stacked cell. Following cell dielectric 71 deposition, a blanket deposition of conformal poly 72 is deposited. Poly plate 61 and poly 72 are conductively doped either n-type or p-type depending on the conductivity type desired for active area 37. Poly 72 now serves as a poly capacitor cell plate which becomes a common cell plate to all mini-stacked storage capacitors in the array.

A second embodiment of the present invention is depicted in FIGS. 8–11 in conjunction with FIGS. 3–5. The steps associated with FIGS. 3–5 are the same as in the first embodiment and only the text describing FIG. 5 is restated here to provide process step continuity. The second embodiment described in the following text results in an increase of storage node plate surface area by approximately 77%.

Referring back to FIG. 5, a BOE etch is performed for approximately 90 seconds to remove the exposed portion of oxide 42 residing between the two adjacent digit lines 22. Though this etch is selective to oxide and will stop at nitride 41, it must be time controlled as the etch will continue to remove oxide 42 thereby tunneling under resist 43. In this embodiment, the etch is allowed to continue in order to tunnel under resist 43 and remove approximately 0.75 $\mu$ of oxide 42.

Figure 8:
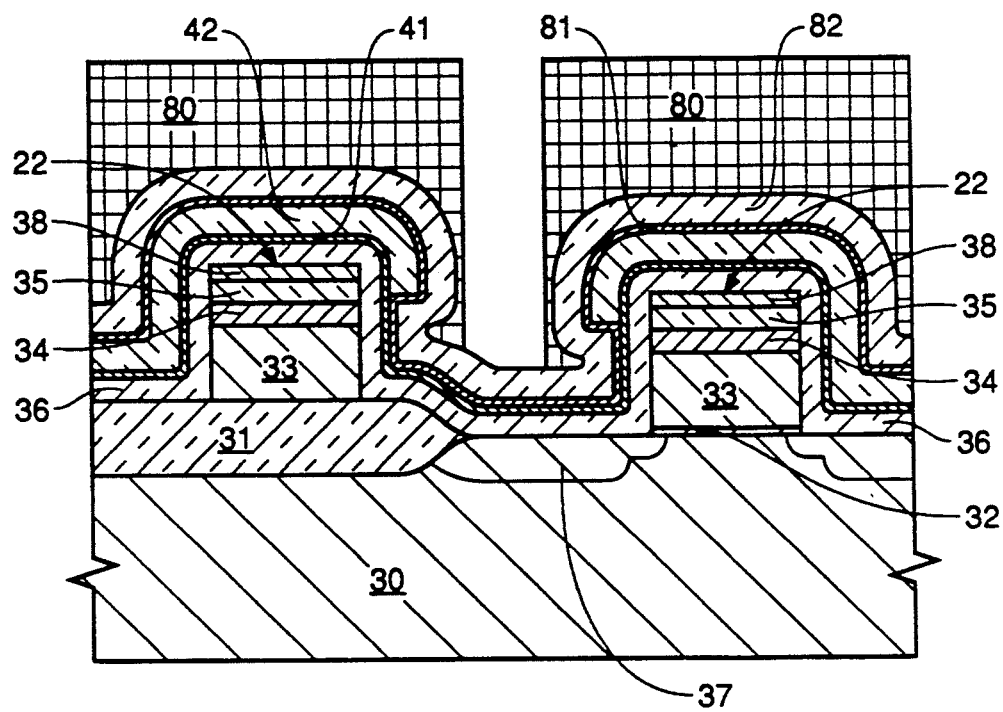
FIG. 8 begins a second embodiment of the present invention in conjunction with FIGS. 3-5 and is a cross-sectional view of the in-process wafer portion of FIG. 5 after a photoresist strip followed by depositions of additional dielectric layers and a second photomask step.

Referring now to FIG. 8, photoresist 43 (of FIG. 5) has been stripped and a second layer of LPCVD nitride 81 (preferably 100 Å thick) is deposited. Next, a third layer of TEOS oxide 82 (approximately 2000 Å) is deposited. Then, a second mask step is performed to place photoresist 80 (using the same mask as in FIG. 4) to allow subsequent etches of underlying dielectrics comprising oxide 82, nitride 81 and oxide 36.

Figure 9:
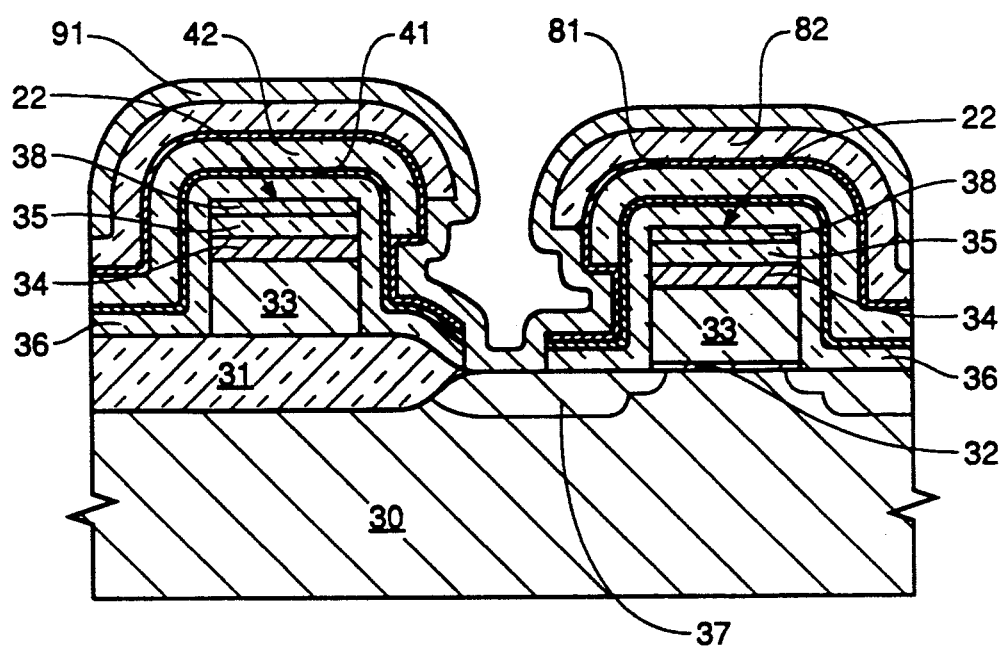
FIG. 9 is a cross-sectional view of the in-process wafer portion of FIG. 8 after a photoresist strip, an etch to remove the fifth dielectric layer followed by an etch to provide access to a conductively doped diffusion region.

Referring now to FIG. 9, a second BOE etch is performed for approximately 100 seconds to remove the exposed portion of oxide 82. A dry etch is performed to remove the portion of nitride 41 and oxide 36 overlying active area 37. For example, the plasma etch, $CF_4+CHF_3+He$, is performed for approximately 90 seconds or until nitride 41 and oxide 36 are cleared from active area 37. Next, resist 80 is stripped and a layer of conformal polysilicon 91 is deposited (preferably 1000Å thick). Conformal poly layer 91 connects to active area 37 via buried contact opening 23. Poly 91 is then patterned (mask not shown) to form a poly storage node plate 91.

Figure 10:
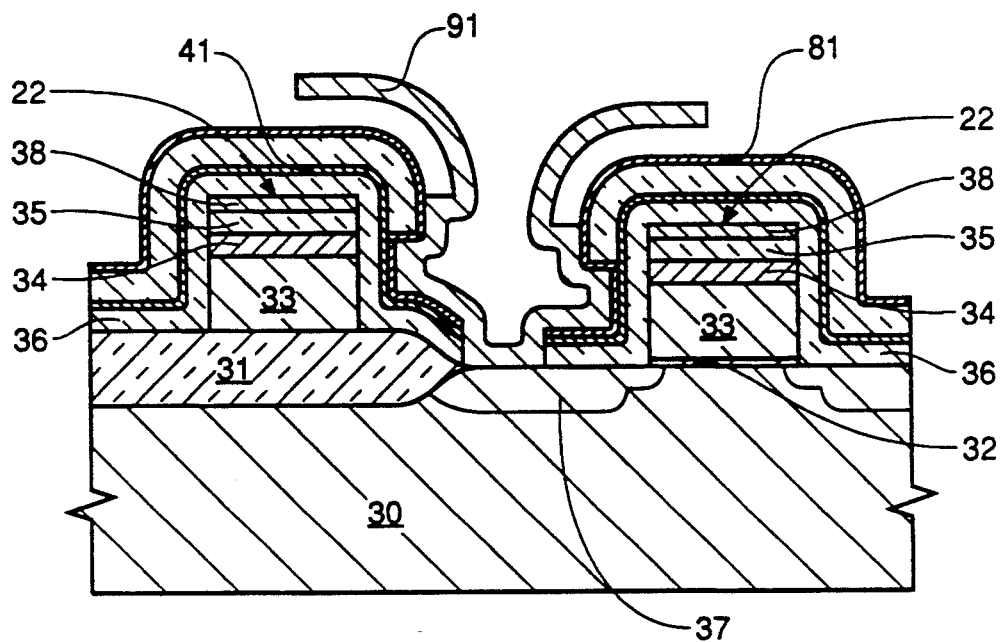
FIG. 10 is a cross-sectional view of the in-process wafer portion of FIG. 9, after patterning a storage node polysilicon plate followed by a subsequent dielectric etch.

Referring now to FIG. 10, an oxide selective etch, such as a BOE, is performed to remove oxide 82 (seen in FIG. 9) thereby exposing an underside portion of poly 91. By exposing the underside of poly 91, in conjunction with the proceeding process steps, the resulting surface area of poly 91 is increased from a typical area of 6.5 $\mu^2$ to a larger surface area of 11.5$\mu^2$ (or approximately 77%).

Figure 11:
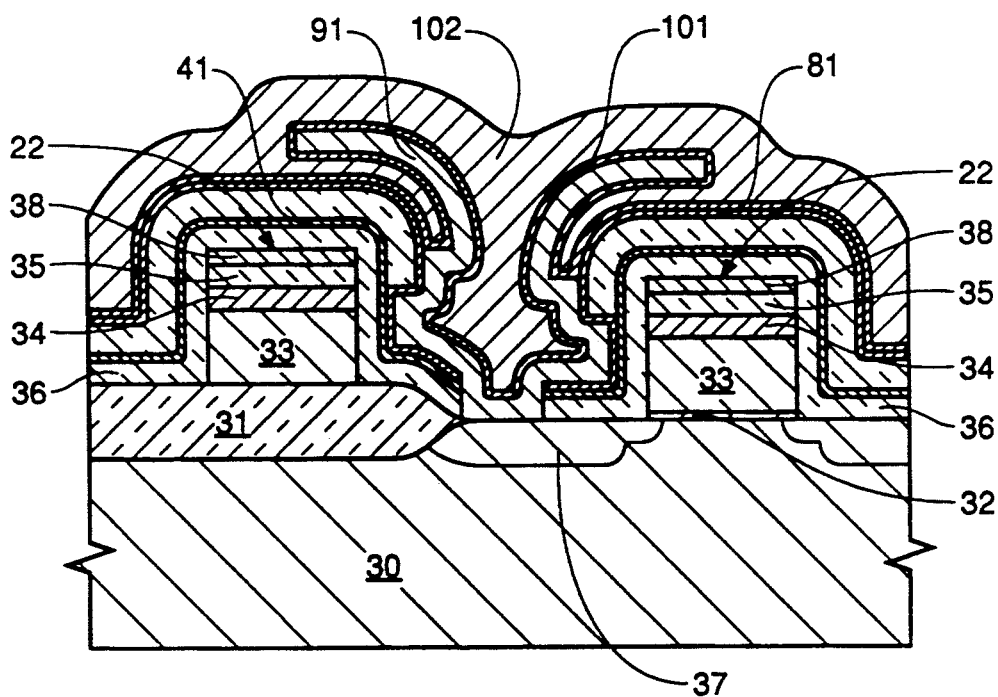
FIG. 11 is a cross-sectional view of the in-process wafer portion of FIG. 10, following depositions of conformal cell dielectric and cell plate polysilicon.

As shown in FIG. 11, dielectric 101 is deposited (preferably by CVD) that conforms to poly storage node plate 91. Dielectric 101 may be selected from materials having a high dielectric constant (such as nitride, an oxide-nitride compound or $Ta_2O_5$) to serve as a cell dielectric for the mini-stacked cell. Following cell dielectric 101 deposition, a blanket deposition of conformal poly 102 is deposited. Poly plate 101 and poly 102 are conductively doped either n-type or p-type depending on the conductivity type desired for active area 37. Poly 102 now serves as a poly capacitor cell plate which becomes a common cell plate to all mini-stacked storage capacitors in the array.

Although the present invention has been described with reference to first and second embodiments, various modifications, known to those skilled in the art, may be made to the structures and process steps presented herein without departing from the invention as recited in the several claims appended hereto.

I claim:

1. A process for fabricating a DRAM storage capacitor on a silicon substrate having active areas, word lines and digit lines, said process comprising the steps of:

a) forming a first dielectric layer on existing surface of said silicon substrate;

b) forming a second dielectric layer adjacent and coextensive said first dielectric layer;

c) forming a third dielectric layer adjacent and coextensive said second dielectric layer;

d) placing and patterning a masking layer to provide a storage node location opening, said opening thereby exposing a portion of said third dielectric between two adjacent digit lines;

e) etching said exposed portion of third dielectric through said opening thereby exposing the underlying second dielectric;

f) removing said masking layer thereby exposing the remaining third dielectric layer;

g) forming a fourth dielectric layer superjacent and coextensive said remaining third dielectric layer and said exposed portion of said second dielectric;

h) forming a fifth dielectric layer superjacent and coextensive said fourth dielectric layer;

i) placing and patterning a second masking layer at said storage node location opening, said opening thereby exposing a portion of said fifth dielectric between two adjacent digit lines;

j) etching said exposed portion of said fifth dielectric through said opening thereby exposing the underlying fourth dielectric;

k) etching fourth, second and first dielectrics through said opening thereby exposing said active areas;

l) removing said masking thereby exposing the remaining third dielectric layer;

m) placing a conformal first conductive layer adjacent and coextensive said exposed active areas, said remaining exposed fifth dielectric and the patterned edges of said first, second, third and fourth dielectrics, said first conductive layer making physical contact to said active areas;

n) masking and etching said first conductive layer thereby forming a storage node plate;

o) etching said remaining fifth dielectric layer thereby exposing underside portions of said storage node plate;

p) forming a cell dielectric layer superjacent and coextensive said exposed portions of said storage node plate; and q) depositing a second conductive layer superjacent and coextensive said cell dielectric layer, thereby forming a top cell plate, said top cell plate being common to the entire memory array.

2. A process as recited in claim 1, wherein said first, second, third, fourth and fifth dielectric layers are formed by chemical vapor deposition.

3. A process as recited in claim 1, wherein said first and said second conductive layers are placed by chemical vapor deposition.

4. A process as recited in claim 1, wherein said etching in step "e" comprises a BOE etch for approximately 90 seconds.

5. A process as recited in claim 1, wherein said etching in step "j" comprises a BOE etch for approximately 100 seconds.

6. A process as recited in claim 1, wherein said etching in "step k" comprises a dry etch.

7. A process as recited in claim 1, wherein said etching in "step n" comprises a dry etch.

8. A process as recited in claim 1, wherein said etching in "step o" comprises a wet etch.

9. A process as recited in claim 1, wherein said first and third dielectric layers are TEOS oxide.

10. A process as recited in claim 1, wherein said first, and second conductive layers are conductively-doped polysilicon.

11. A process as recited in claim 1, wherein said second and fourth dielectrics and said cell dielectric layers are nitride.

* * * * *

UNITED STATES PATENT AND TRADEMARK OFFICE
CERTIFICATE OF CORRECTION

PATENT NO. : 5,145,801
DATED : September 8, 1992
INVENTOR(S) : Navjot Chhabra

It is certified that error appears in the above-indentified patent and that said Letters Patent is hereby corrected as shown below:

```
Column 3, lines 32-33, delete "exposing the" and insert
-- superjacent and --.
```

Signed and Sealed this

Twenty-ninth Day of March, 1994

Attest:

BRUCE LEHMAN

*Attesting Officer*     *Commissioner of Patents and Trademarks*